United States Patent [19]

Steenblik et al.

[11] Patent Number: 5,359,454

[45] Date of Patent: Oct. 25, 1994

[54] APPARATUS FOR PROVIDING AUTOSTEREOSCOPIC AND DYNAMIC IMAGES

[75] Inventors: Richard A. Steenblik, Stone Mountain; Mark J. Hurt, Alpharetta, both of Ga.

[73] Assignee: Applied Physics Research, L.P., Atlanta, Ga.

[21] Appl. No.: 931,871

[22] Filed: Aug. 18, 1992

[51] Int. Cl.⁵ .................... G02B 27/22; G02B 27/12
[52] U.S. Cl. .................................. 359/463; 359/619
[58] Field of Search ............... 359/463, 619, 893, 894, 359/567, 738

[56] References Cited

U.S. PATENT DOCUMENTS

| | | |
|---|---|---|
| 1,260,682 | 3/1918 | Kanolt . |
| 1,918,705 | 7/1933 | Ives .................... 359/463 |
| 3,161,509 | 12/1964 | Howe et al. .................... 359/463 |
| 3,306,974 | 2/1967 | Cunnally .................... 178/5.2 |
| 3,357,770 | 12/1967 | Clay .................... 359/463 |
| 3,365,350 | 1/1968 | Cahn .................... 359/463 |
| 3,459,111 | 8/1969 | Cooper .................... 359/619 |
| 3,607,273 | 9/1971 | Kinney . |
| 3,706,486 | 12/1972 | de Montebello .................... 359/619 |
| 3,953,869 | 4/1976 | Wah Lo et al. .................... 354/115 |
| 4,120,562 | 10/1978 | Lo et al. .................... 350/130 |
| 4,158,501 | 6/1979 | Smith et al. .................... 355/77 |
| 4,468,115 | 8/1984 | Lao .................... 355/22 |
| 4,596,458 | 6/1986 | Gundlach .................... 355/22 |
| 4,600,297 | 7/1986 | Winnek .................... 355/22 |
| 4,667,092 | 5/1987 | Ishihara .................... 359/619 |
| 4,674,853 | 6/1987 | Street .................... 354/112 |
| 4,853,769 | 8/1989 | Kollin .................... 358/88 |
| 4,903,069 | 2/1990 | Lam .................... 355/22 |
| 4,920,039 | 4/1990 | Fotland et al. .................... 430/324 |
| 5,113,213 | 5/1992 | Sandor et al. .................... 355/22 |
| 5,132,839 | 7/1992 | Travis .................... 359/463 |

FOREIGN PATENT DOCUMENTS 63-8039 7/1989 Japan .................... G03B 13/24

OTHER PUBLICATIONS

Takanori Okoshi, Three-Dimensional Imaging Techniques, 1976, New York, pp. 13-28 and 366-368.
Herbert E. Ives, The Chromolinoscope Revived, Jun. 1930, New York, pp. 345-347.

Primary Examiner—Jon W. Henry
Attorney, Agent, or Firm—Deveau, Colton & Marquis

[57] ABSTRACT

A light control material includes a two-layer optical system for producing autostereoscopic and dynamic images in thin-film materials. The first layer comprises focusing optics which have a plurality of focusing elements. These elements may consist of refractive optics, binary optics, or mixed optics. The second layer comprises light control optics having dark zones and bright zones for providing directional control of light through the focusing optics. The bright zones may be comprised of a light transmissive material, or the light control optics may include a reflective layer for reflecting light at the bright zones. The dark zones may be formed by using an opaque material, preferably pigmented ink, on a substrate.

20 Claims, 6 Drawing Sheets

APPARATUS FOR PROVIDING AUTOSTEREOSCOPIC AND DYNAMIC IMAGES

TECHNICAL FIELD

The present invention relates to the production and display of autostereoscopic and dynamic images, and more particularly to a technique for producing autostereoscopic and dynamic images in thin-film material. The present invention further relates to the production of specialized light control films and to the surface figuring of plastic film useful for the production of such images.

BACKGROUND OF THE INVENTION

Currently, image display methods which enable the presentation of multiple images from different viewing angles fall into three broad categories: projection-type (non-holographic) displays, lens-sheet displays and holographic displays. Any of these methods can be used to display autostereoscopic depth images, motion images and color changing images.

The most common technique of producing projection-type displays is the barrier strip method. A barrier strip display device consists of an interleaved image which typically consists of strips taken from each of the images that are to be displayed. The strips comprising each of the images are interleaved parallel to each other so that every Nth strip is from the same image, where N is the number of images. This number may be as small as two or as large as nineteen or more. The interleaved image is disposed in close proximity to and parallel to a viewing mask. The viewing mask contains parallel opaque lines of equal width which are separated by transparent zones having a uniform width which is equal to or less than that of the opaque lines. Barrier strip images are usually viewed from the mask side by means of light transmitted through the interleaved image and the mask. The intensity of the back illumination required depends on the brightness of the viewing environment and on the number of images which are interleaved. The color that is perceived at a particular point and at a particular viewing angle with a barrier strip display device is determined by the color of the image strip which is visible through the mask at that point.

Though barrier strips are capable of displaying autostereoscopic images, a barrier strip display device will produce this effect only when certain conditions are satisfied. First, the mask lines must lie in a plane orthogonal to that of the observer's eyes. Also, the width and spacing of the transparent mask lines and the distance from the interleaved image to the mask must be such that each of the viewer's eyes sees different, non-overlapping regions of the interleaved image through the transparent mask lines. The interleaved image must have been constructed such that each of the image lines visible to the right eye is part of a right eye stereo pair image, and the image lines visible to the left eye are each part of a matching left eye stereo pair image. The distances and positions at which stereoscopic depth is perceived is restricted by the geometry of the mask, the number of interleaved images and the mask-to-image distance.

In addition to the difficulty in achieving an autostereoscopic effect, a significant limitation on barrier strip image devices is that the thickness of such a device is governed by the number of images it presents, the width of the image strips and the intended viewing distance. The distance between the barrier strips mask and the interleaved image is generally a large multiple of the width of a single image strip. A typical barrier strip device has a thickness of about six (6) millimeters, making it an unacceptable technology for mass production. The barrier strip method is further limited in that it is only useful as a back-illuminated image display method.

Among the most common lens-sheet display techniques are integral photography, integrams and lenticular sheets. Integral photography (referred to in the trade as the "fly-eye" approach) involves photographing an image through a plastic sheet into which small fly's-eye lenses (typically 50,000 lenses per sheet) have been impressed. The lenses cause a complete reproduction of the photographed image to be reproduced behind each tiny lens. This approach can recreate a visually complete three-dimensional image, but can only be reproduced at great expense. A further limitation of this lens sheet is that the images are at such a fine resolution that they cannot be reproduced on printing presses, but have to be reproduced photographically. Images produced by this method also have a very restricted viewing angle within which the image reconstructs correctly.

The integram approach to lens-sheet displays is a complex extension of the fly-eye approach. It involves positioning the captured image along a precisely curved surface (dimensionally matching the focal surface of the fly-eye lens) to overcome the viewing angle restrictions. The expense and difficulty in producing high quality three-dimensional images with this method, however, have prevented any large scale commercial success.

A third method of the lens-sheet display technique currently known is the lenticular screen display device. A lenticular screen display device employs an array of cylindrical lenses to control the viewing angle of interleaved image strip. The lenses are disposed parallel to the image strips between the observer and the image strips such that the image strips directly underneath a lens lies at or near the lens' focal plane. The range of angles through which the image will be visible is determined by the position of each image strip underneath the lens array. As with the barrier strip method, the color of the image strip determines the color that will be perceived at the point of the lenticular screen processed image.

As with the barrier strip method, a significant limitation on the lenticular screen display device is that its thickness is dependent on the width of the image strips. The thickness also is limited by the number of images presented, the designed viewing distance, and the focal properties of the lens. The thickness of these devices is in general greater than the width of the image strip multiplied by the number of images. As a result, a typical lenticular screen display device has a thickness of about one (1) millimeter, making it relatively expensive for mass production, and generally too thick for automated printing press equipment.

The third broad category of currently known methods of producing and displaying autostereoscopic images is holographic displays. Holographic displays use holograms to reconstruct the appearance of an object over an angular range of view without the use of a lens. A hologram is a record of a diffraction pattern representing an object as viewed from a certain range of positions. There are many types of holograms, each of which possesses its own range of viewing conditions. Some holograms require laser illumination for the reconstruction of an image, while others can be viewed by means of incoherent white light. Holograms displaying full color over a range of viewing angles normally require illumination by three lasers—red, blue and green—simultaneously. White light viewable holograms are generally either monochromatic or display a rainbow coloration which varies according to the viewing angle. Holograms are capable of displaying autostereoscopic, motion, combined autostereoscopic and motion, and color-change images. However, creating and reproducing a high quality hologram is a time-consuming and difficult process. Holograms cannot be created by printing and are not easily combined with the mass production of printed articles. Holograms are expensive and difficult to originate. They also require special equipment to impress onto a printing substrate. Because of their restrictive viewing conditions and limited control of color, the practical applications of holographic displays is very limited.

Until the present invention, no one has developed a device for providing printed autostereoscopic and dynamic images on thin-films (e.g., those with the approximate thickness of conventional paper). Due to their thickness limitations, neither the barrier strip devices nor the lenticular screen devices are amenable to the production of thin-film images. This has prevented the widespread application of these devices because conventional printing presses are designed to handle paper and paper-like materials. The thickness of barrier strips and lenticular screen display devices also makes them inherently stiff, further limiting their mass production potential. These devices are further limited in application because of the inherent inflexibility in the location of the printing within their structure. The print must be at the focus of the lenticular screen or be on the opposite side of the substrate from the barrier strips. It is not possible to print on top of the lenticular screen nor on top of the barrier strip surface and still retain the ability to display the desired set of multiple images.

SUMMARY OF THE INVENTION

The present invention comprises an apparatus for producing thin-film autostereoscopic and dynamic images. The present invention differs from a conventional lenticular screen display structure in that the thickness of the present structure is independent of the width of the image strips. The invention is therefore capable of producing autostereoscopic and dynamic images with a structure that is approximately as thin as conventional typing paper, on the order of two to three (2-3) mils, or 50 to 75 microns, thick. This is accomplished through the use of a light control material comprised of a multi-layer optical system. In one embodiment of the present invention, the first layer of the optical system (generally referred to as the "outer optic", i.e., the layer closest to the observer) consists of focusing elements. These elements may consist of refractive cylindrical lenses, diffractive optic lenses or mixed optic lenses. The second layer consists of light control optics (often referred to as the "inner optic"). This layer is designed to provide directional control of the light passing out through the outer optic to the observer. The inner optic consists of a pattern of bright zones disposed parallel to the axial direction of the outer optic lenses. Light absorbing or light dispersing zones (dark zones) separate the bright zones on the inner optic from each other.

In the present invention, the inner and outer optics cooperate to perform the light directional control function. This differs from the conventional approach in which the light directional control function is performed solely by the position of each image element under the lenticular screen. The image to be displayed is divided into a number of image elements. To produce an autostereoscopic or dynamic image, it generally is desirable to direct the light passing through a single image element in a particular direction. In the present invention, the inner optic pattern is designed to direct the light emitted from all the lenses associated with that image element in the same direction. If it is desirable to direct the light passing through the adjacent image element elsewhere, the inner optic pattern may be adjusted in that area to send all of the emitted light in the desired direction. The end result is that the present invention enables an observer to perceive one image element with one eye and a different image element with the other eye, thus creating the perception of autostereoscopic depth, motion or color change.

The present invention may be used as a transmission material, in which case the bright zones of the inner optic are substantially transparent and the image is back-illuminated. It may also be used as a reflection material, in which case the bright zones of the inner optic may be specularly reflective, diffusively reflective, or may bear a reflective diffraction pattern which concentrates light from one direction and redirects it towards the observer.

In a second embodiment, a low refractive index layer, preferably a polymer, is applied to the layer of high refractive index focusing optics. The polymer creates a smooth surface which is more suitable for printing than conventional devices.

In a third embodiment, the position of the focusing optics and the light control optics is reversed. In this third embodiment, the light control optics, including the bright and dark zones, is the outer layer of the light control material and the focusing optics are positioned underneath the light control optics.

The light control material of the present invention is intended for use with a series of image elements which have the effect of serving as a color filter. Unlike prior approaches, the image elements may be positioned between the focusing optics and the light control optics or to one side or the other of the bi-layer optics as described in more detail bellow. The positioning of the image elements is unrelated to the focal length of the focusing optics.

Accordingly, it is an object of the present invention to provide a method for producing novel materials which display multiple images from different viewing directions.

It is also an object of the present invention to provide a method for producing multiple-image display materials in which the thickness of the material is independent of the image strip width.

It is also an object of the present invention to provide a method for producing autostereoscopic images in thin film materials.

It is a further object of the present invention to provide a method for printing thin film autostereoscopic images.

It is yet another object of the present invention to provide a method for producing engineered light control films.

It is still another object of the present invention to provide a method for increasing the brightness of printed images.

A further object of the present invention to provide a method for producing thin film images which display motion.

It is a final object of the present invention to provide a method for producing the film images which display color changes when viewed from different angles.

DETAILED DESCRIPTION

Figure 1:
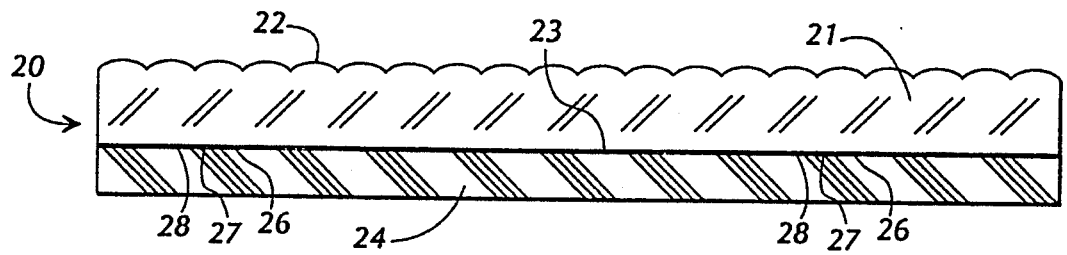
FIG. 1 is a cross-sectional view of a prior-art conventional lenticular screen structure.

Referring now in detail to the drawing figures, in which like reference numerals represent like parts throughout the several figures, FIGS. 1 and 2a-c show a conventional lenticular screen display device 20, which consists of a layer of optical material 21 bearing an array of cylindrical lenses 22 on its upper surface and an image 23 in contact with its lower surface. The image 23 is generally supported upon a substrate 24. The image 23 is typically created by interleaving image strips from a multiplicity of images. If, for example, three images are used, then image 23 would consist of right, center, and left image strips 26, 27 and 28.

Figure 2A:
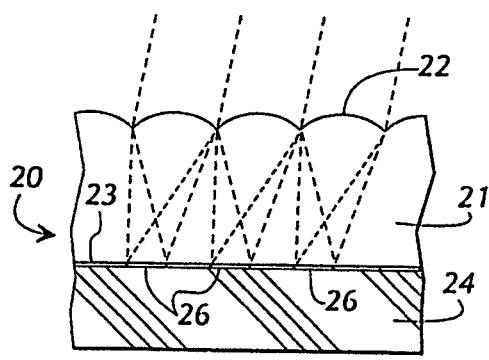
FIGS. 2a-c are cross-sectional views of a conventional lenticular screen structure illustrating the direction of view from each of the right, center, and left image strips.
Figure 2B:
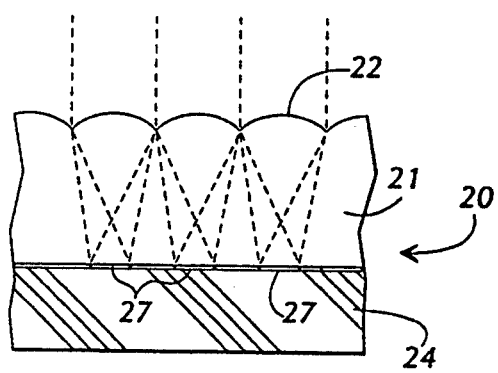
Figure 2C:
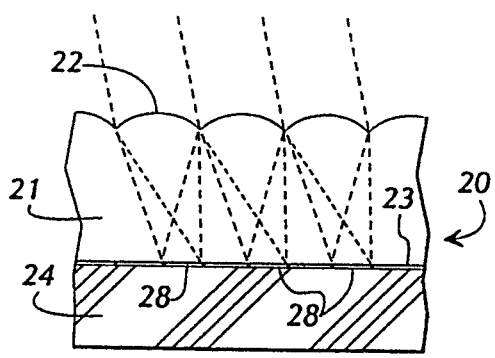

FIG. 2a depicts how the array of lenses 22 in the conventional lenticular screen display device 20 controls the direction of view of each of the right image strips 26. Light reflecting from each image strip 26 is directed by the lenses 22 toward the observer's right eye. FIG. 2b depicts that the center image strips 27 are located adjacent to the right image strips. By virtue of their different position underneath the lens array 22, the light reflected from the center image strips 27 is directed by the lenses 22 in a slightly different direction than that of the right image strips. Light from these strips may be intercepted by the observer's left eye. In the case of an autostereoscopic image, the observer would be viewing a stereo pair, different images with each eye, and would thus perceive a stereoscopic image. FIG. 2c depicts how light reflecting from the left image strip is similarly directed in a third direction. If the observer's position changes such that the center image is intercepted by the right eye and the left image is intercepted by the left eye, a slightly different view of the autostereoscopic scene will be perceived, since right and center images comprise a stereo pair, and center and left comprise a stereo pair.

Figure 3A:
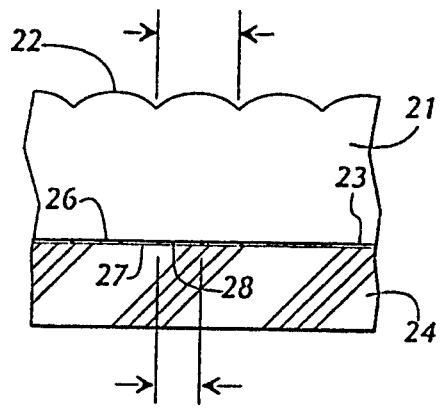
FIGS. 3a-b are comparison scale drawings illustrating the thickness of a conventional lenticular screen structure and that of the present invention.

The width of the individual lenses in the conventional lenticular screen method must be some multiple, n, of the image strip width, where n is an integer. Because of the limitations of the focusing optics 22, the thickness of the lens in a lenticular screen display device will also be some multiple of the print strip width 29, as shown in FIG. 3a. The minimum strip width of printed images is set by the smallest shape which can be reliably printed, which will generally be the size of a single print dot. Printing presses vary in their printing resolution, but a commercial printing press rarely exceeds a printing resolution of 175 lines/inch, or a print dot spacing of about six thousandths of an inch (152 microns). As a result, the width and thickness of a conventional lenticular screen device 20 can never be less and is typically much larger than the dimensions of the print dot spacing.

Figure 3B:
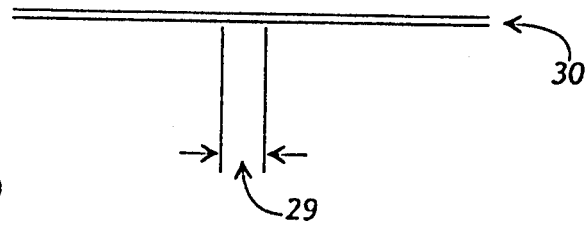

The present invention circumvents this size limitation. The thickness of the present invention is independent of the print dot spacing and the size of the print. FIG. 3b illustrates the relative thickness of the present invention 30 for the same print width 29. FIGS. 3a and 3b are drawn to the same scale to show the magnitude of the difference between the thickness of a conventional lenticular screen device and that of the present invention for the same print width. The optical thickness of the present invention for images printed at 175 lines/inch would typically fall in the range of from 1-3 mils, compared with 17 to 50 mils for a conventional lenticular screen device.

Figure 4:
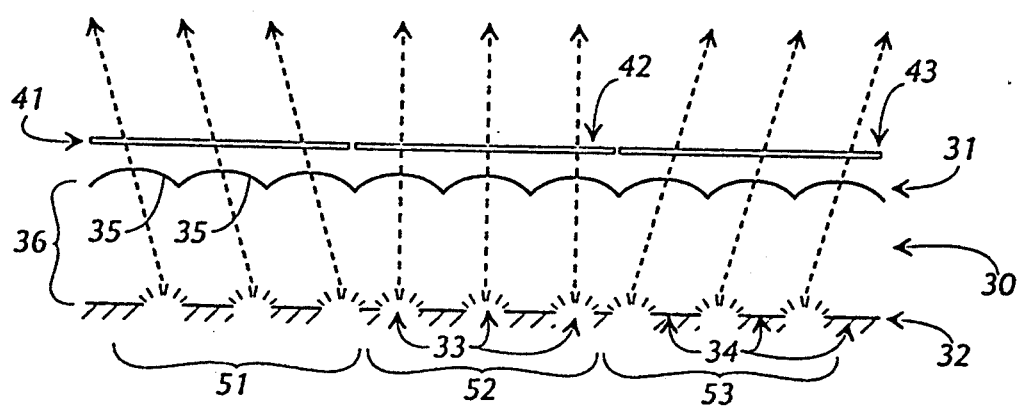
FIG. 4 is a cross-sectional view of a first embodiment according to the present invention including three image elements.

Referring now to FIG. 4, the basic configuration and operation of the present invention is shown. The light control material 30 comprises a two-layer optical system separated by a refractive material 36. It is the two-layer optical system that allows the thickness of the device to be independent of the print size. In one embodiment of the present invention, the first layer comprises focusing optics 31 and is sometimes referred to as the "outer optic" (i.e., closest to the observer). The focusing optics 31 generally consist of an array of lens elements 35. The second layer contains light control optics 32 and is sometimes referred to as the "inner optic". The layer of light control optics 32 consists of a pattern of bright zones 33 disposed generally parallel to the axial direction of the focusing elements 35. The bright zones 33 are separated from each other by dark zones 34, which may be either light absorbing or light dispersing. The composition of the focusing optics 31 and the light control optics 32 will be discussed in detail below.

FIG. 4 also illustrates the cooperation of the focusing optics 31 and the light control optics 32 for light directional control. In FIG. 4 the light source (not shown) is located underneath the light control optics 32, and the light control material 30 is operating in a light transmissive mode. Three image elements (left image element 41, center image element 42, and right image element 43) are placed above the focusing optics 31. While FIG. 4 shows three image elements, the present invention is not limited to that number of image sets. The device will operate with as few as two sets of image elements (e.g., up/down or left/right) or with many more than that. Some applications which are not brightness sensitive could tolerate (and benefit from) a large number of image sets, such as four, five, or more. The relative positions of the image elements 41-43 and the focusing optics also is not important. The light directional control function may be performed with the image elements 41-43 placed either above the focusing optics 31 as shown in FIG. 4, in between the focusing optics 31 and the light control optics 32, or below the light control optics 32.

Assuming the device is operating with three sets of image elements, the light control material is divided into three image zones—a left image zone 51, a center image zone 52 and a right image zone 53. The center image zone 52 is formed by positioning the associated bright zones 33 directly below the center of the lens elements 35. Light passing through the center image zone 52 will be directed through the focusing optics 31 above it and transmitted through the center image element 42 as center directed light (this light may be intercepted by the observer's right eye). The left image zone 51 is formed by laterally shifting the position of the associated bright zones 33 to the right so that the center of the bright zones are no longer aligned with the center of the lens elements 35. Light passing through the left image zone 51 will then be directed through the left image element 41 and transmitted as left directed light (this light may be intercepted by the observer's left eye, forming a stereo pair with the center image zone light directed to the right eye). The right image zone 53 is similarly formed by laterally shifting the associated bright zones 33 to the left. Light passing through the right image zone 53 will be directed through the right image element 43 and transmitted as right directed light (if the observer's position shifts so that the center image light is intercepted by the observer's left eye, then the right directed light may be intercepted by the observer's right eye, forming a stereo pair).

The image elements 41-43 will generally be composed of transparent, colored print dots that serve to color the light but will not control the directions of visibility of the lenses depicted. The resulting system therefore enables an observer to perceive one set of image elements from one eye and a different set of image elements from the other eye, thereby creating the perception of autostereoscopic depth, motion or color change.

FIG. 4 shows three sets of lenses 35 for each image element for simplicity. However, the present invention need not be limited to this number. The number of lenses that are spanned by each image element will be a design variable, depending on the printing resolution, the width of the image elements, and the size of the lenses. The actual number of lenses devoted to a single image element can range from one lens to more than twenty. A typical number will be six to nine lenses per image element. The image elements do not necessarily have to cover the entire surface of the light control material. In general, each image element need only lie over its respective image zone, but the image elements do not have to be in perfect registration with the image zones. Also, the spacing between the image elements is not critical. Each image element does not have to be equally spaced from the edge of its respective image zone.

Figure 5:
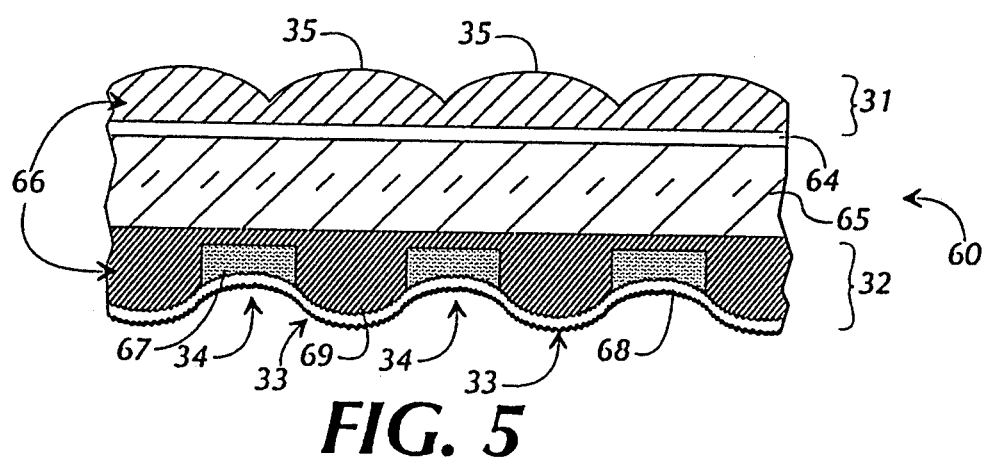
FIG. 5 is a cross-sectional view of the first embodiment of the present invention.

While FIG. 5 shows the bright zones in the center image zone 52 aligned directly beneath the center of the associated lens elements 35, this alignment is not critical to the performance of the invention. The actual position of the lens elements over the light control optics is not important. What is important is the pattern of the light control optics 32. The spacing of the bright zones is periodic in each image zone so that the period of the bright zones matches the period of the lens elements. As long as the lateral spacing of the light control optics is fixed and the lateral positioning of the focusing optics is fixed, the relative positions of the two layers is not important. This allows "slip" in the operation of the device and thus makes it easier to manufacture.

Viewed from above without any image elements, an observer looking at the light control material would see a set of very fine bright strips separated by very fine black strips. The relative width of the bright strips would depend on the pattern of the light control optics. With one eye, an observer would see one set of trips that are bright. The other eye would see a different set of strips that are bright. The set of strips that appear bright with the left eye will appear dark with the right eye, and vice versa. When the image elements are imposed onto the light control material, the observer is able to see one image element set with one eye and another image element set with the other eye, thus creating the perception of autostereoscopic depth, motion or color change.

Referring now to FIG. 5, the details of the focusing and light control optics will be explained. The focusing optics 31 consists of an array of refractive cylindrical lenses 35. Alternatively, the focusing optics may consist of diffractive lenses, hybrid refractive/diffractive cylindrical lenses, or reflective focusing troughs of conventional geometry, diffractive form or hybrid form. These lenses 35 will generally be made from a photopolymer 66 or other photo-initiated acrylated epoxies. A preferred method for producing the focusing optics is by "soft" embossing the photopolymer 66 onto an optical substrate 65, i.e., casting the liquid plastic against a roller that has the desired geometry and allowing it to cure. While "soft embossing" is preferred, other methods may be used to produce the focusing optics. For example, "hard" embossing, i.e., impressing a soft, but not liquid, plastic against a roller that has the desired pattern, can also be used to obtain the same desired effect. Additional methods suitable for producing the focusing optics include injection molding, compression molding, extrusion, and casting. The soft embossing technique is preferred because it generally enables higher precision replication than hard embossing and it also reduces the amount of tool wear. The width of the individual lenses 35 in the focusing optics 31 is very small, generally falling in the range from 8 to 25 microns.

FIG. 5 is a small section of the light control material of the present invention, showing a single image element 64 positioned between the focusing optics 31 and the light control optics 32. As noted above, however, the invention also will produce the desired effects if the positions of the image element 64 and focusing optics 31 are reversed.

The photopolymer 66 is embossed onto a transparent optical substrate 65. This substrate will preferably be a polyester material, but other commercial plastic film materials such as polypropylene can also be used.

The second layer of the light control material 30 contains light control optics 32. The light control optics 32 are designed to provide directional control of the light passing out through the focusing optics 31 to the observer. The layer of light control optics 32 consists of a pattern of bright zones 33 separated from each other by dark zones 34. In general, the distance from one edge of one bright zone 33 to the corresponding edge of the next bright zone is the same as the width of one lens above it. In one preferred embodiment, the dark zones 34 are formed by applying an opaque material 67 onto those areas of a reflective surface 68 that are to absorb incident light. The opaque material 67 preferably comprises pigmented ink, but any light absorbing optical structure or light dispersing optical structure can also be used. Those zones of the reflective surface 68 not covered by the opaque material 67 form the bright zones 33 of the light control optics. Optionally, those areas that are to be bright zones 33 can also be formed by applying a diffractive, holographic, or diffusing pattern 69 on the bright zones of the light control optics. The reflective surface 68 conforms to diffractive, holographic, or diffusing pattern 69. The addition of a diffractive pattern 69 to the surface 68 serves to enhance the brightness of the bright zones 33 at chosen viewing angles. The light control optics 32 may be embossed with the same photopolymer 66 that is used to emboss the focusing optics 31. A preferred layer 68 consists of a layer of highly reflective metal, preferably aluminum.

Formation of the dark zones 34 in the light control optics 32 is not restricted to using an opaque material. For example, the dark zones 34 may also be formed by designing a field of cones or other geometric patterns in the substrate 68 which have the function of "capturing" incident light.

In the embodiment of FIG. 5, the light source (not shown) is above the focusing optics 31, and the invention will operate in a light reflective mode as compared to the light transmissive mode of the embodiment shown in FIG. 4.

Figure 6:
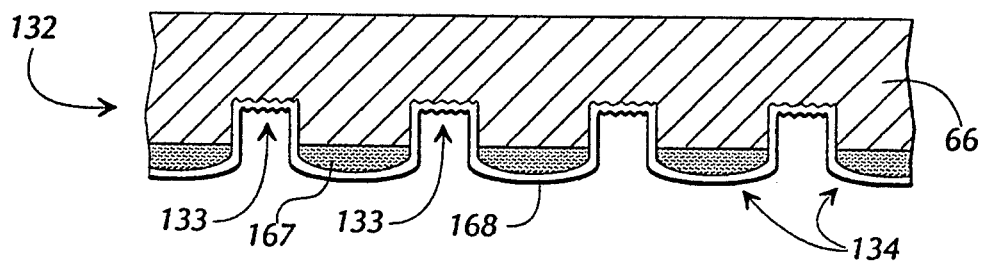
FIG. 6 shows a first alternative embodiment of the light control optics of the present invention.
Figure 7:
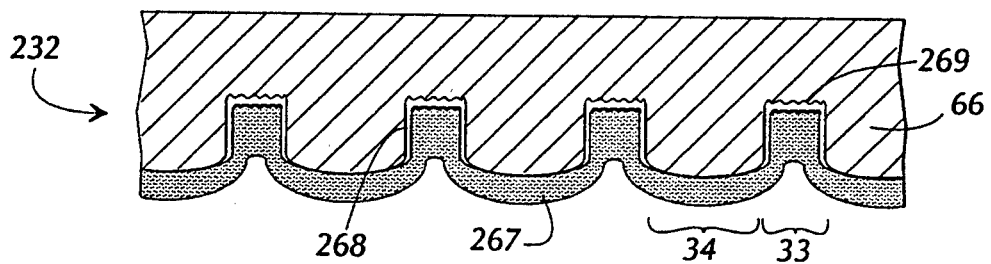
FIG. 7 shows a second alternative embodiment of the light control optics of the present invention.
Figure 8:
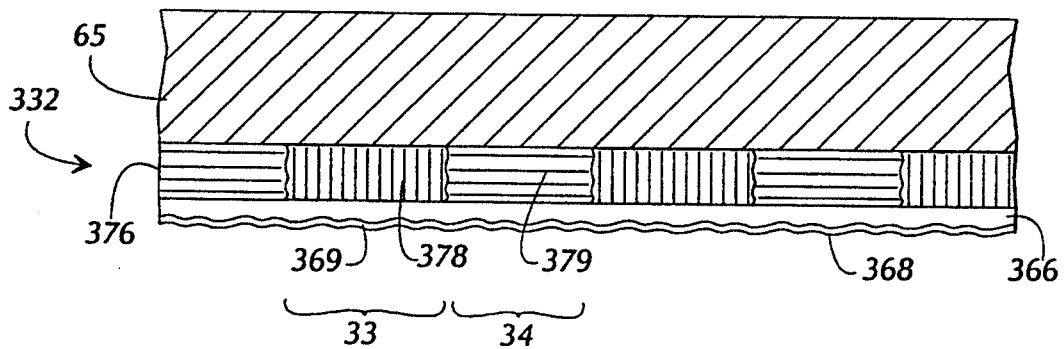
FIG. 8 shows a third alternative embodiment of the light control optics of the present invention.

While FIG. 5 shows one preferred embodiment of the invention, there are numerous alternative ways of designing the light control optics, as shown in FIGS. 6-8. FIG. 6 shows an alternative design in which the geometric pattern of the light control optics 132 is the reverse of that shown in the preferred embodiment. In other words, the bright zones in this embodiment are located in those areas where the dark zones were located in the first embodiment. In this embodiment, the dark zones 134 are formed in the recessed notches created in the reflective substrate 168 with an opaque material 167 and the bright zones 133 are formed in between. The relative positions of the dark zones and the bright zones along the light control optics are reversed from that of the embodiment shown in FIG. 5. In the embodiment of FIG. 6, the present invention will function in a light reflective mode due to the presence of the reflective layer 168.

FIG. 7 shows a second alternative design for the light control optics 232. In this design, the opaque material 267 is in effect the substrate. The bright zones 233 are shown with a reflective layer 268, preferably of aluminum, and a diffractive pattern 269. The bright zones 233 here are formed by covering selected portions of the opaque substrate with reflective layers 268.

FIG. 8 shows a third alternative design for the light control optics. In this embodiment, the light control optics 332 consist of a photographic emulsion layer 376. The bright zones are formed as transparent emulsion zones 378, and the dark zones are formed as opaque emulsion zones 379. A transparent material 366 (preferably a photopolymer) is layered below the photographic emulsion layer 376. Below the transparent material 366, a reflective layer 368 is applied to the diffractive pattern 369 so that the device will function as a reflective material.

Figure 9:
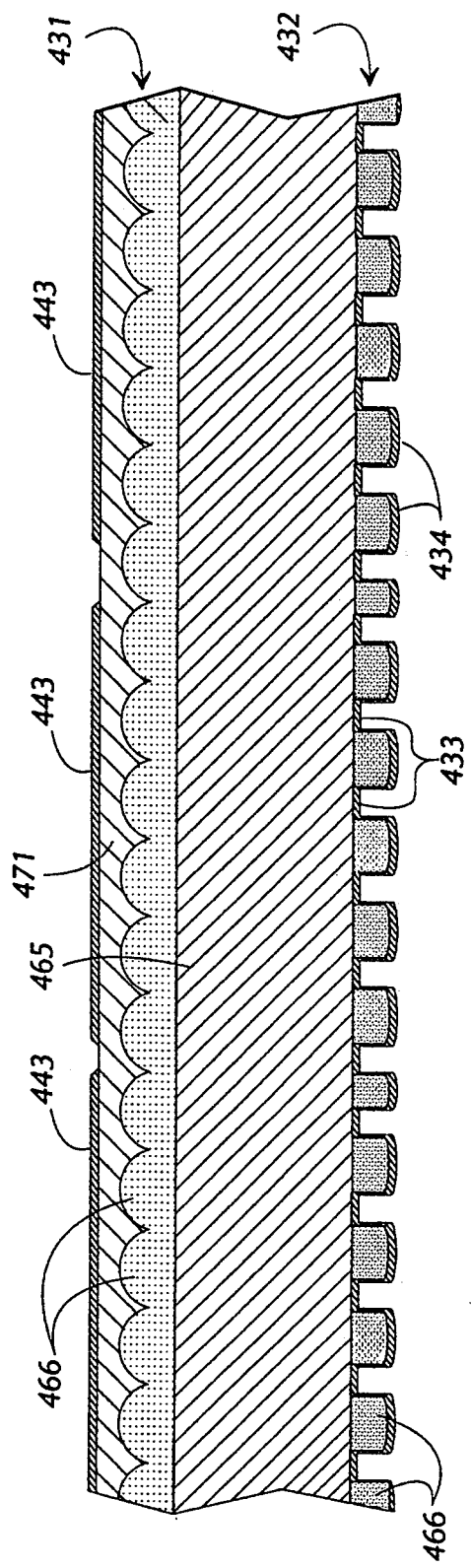
FIG. 9 is a cross sectional view of another alternative embodiment of the present invention.

FIG. 9 shows another embodiment of the invention in which focusing optics 431 with a high refractive index are embedded in a low refractive index layer 471. The focusing optics 431 will preferably be made from a photopolymer 466 with a refractive index of up to about 1.55, but other photo-initiated acrylated epoxies with refractive indexes of about 1.6 can also be used. The low refractive index layer 471 will preferably consist of a polymer. The polymer does not necessarily have to be a photopolymer, but one could be used if it had a low enough refractive index. It is desirable that the polymer have as low a refractive index as possible in order to counterbalance the high refractive index of the focusing optics 431. Examples of polymers that can be used for the low refractive index layer 471 (and their respective refractive index) are polytetrafluoroethylene (PTFE, "Teflon")(1.35), fluorinated ethylene propylene (FEP)(1.34), polyvinylidene fluoride (PVDF)(1.42), and polytrifluorochloroethylene (PTFCE)(1.43). The function of the low refractive index layer 471 is to make the surface of the light control material smooth, thereby making the device more amenable for printing. The low refractive index layer may be formed by, for example, a melt process allowing the polymer to be applied as a liquid and to be self-leveling. The low refractive index layer 471 may also be used as an adhesive between the high refractive index lenses 431 and a polymer film having better printing characteristics. The focusing optics 431 are designed with a particular radius of curvature depending on the refractive index of the polymer. The lower the refractive index of the polymer 471, the lower the curvature of the lenses. The closer the refractive index of the polymer 471 approaches the refractive index of the photopolymer 466, the more curved the lenses have to be. The higher the refractive index of the photopolymer 466, the thinner the light control material.

The photopolymer 466 is embossed onto an optical substrate 465, consisting of a commercial plastic film such as polyester. In this embodiment, the refractive index of the optical substrate 465 is not critical. A change in the refractive index of the optical substrate 465 is easily compensated for by changing the thickness of the plastic film material. In general, the higher the refractive index of the optical substrate, the thicker the film material required.

Figure 10:
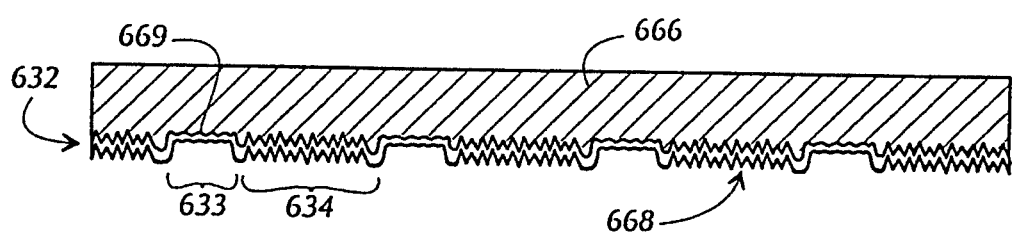
FIG. 10 is a cross-sectional view of a further alternative embodiment of the present invention.

FIG. 10 shows a further alternative embodiment for the light control optics 632 of the present invention. In this embodiment, the substrate is formed of a reflective layer 668 which comprises both bright zones 633 and dark zones 634. The bright zones have a diffractive pattern 669. The dark zones are formed of fields of cones. In their preferred form the cones in the dark zones have an aspect ratio of their height being 4 times their width or greater. In this manner light entering the dark zones does not reflect back out of the dark zones. A photopolymer 666 as previously described covers the substrate.

Figure 11:
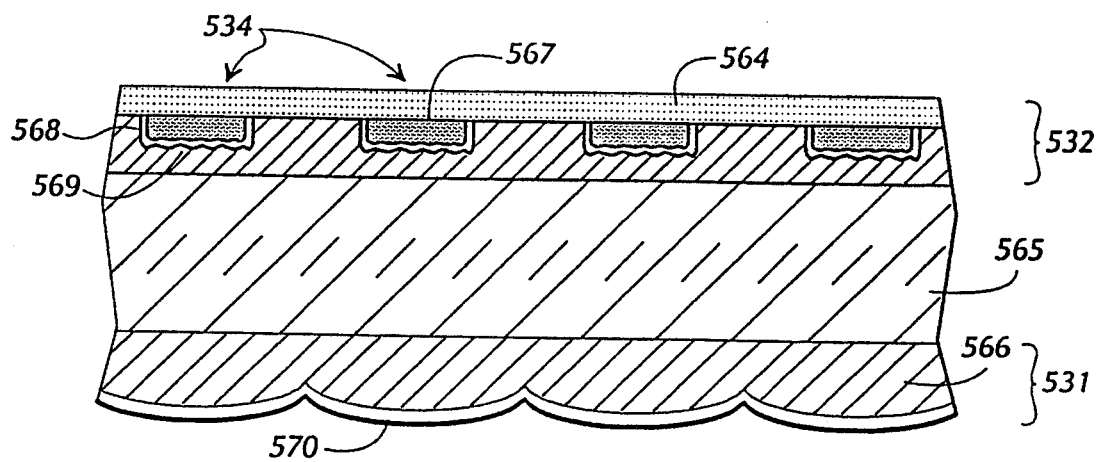
FIG. 11 is a cross-sectional view of yet another alternative embodiment of the present invention.

FIG. 11 shows another embodiment of the invention in which the relative positions of the focusing optics and light control optics are reversed. This embodiment also is formed using a transparent substrate 565. The light control optics 532, here used as the "outer optic", consists of zones 534 which appear dark from the outside of the structure but reflective from the inside of the structure, which zones are made by applying an opaque material 567 to a reflective substrate 568, such as aluminum. A diffractive pattern 569 may also be applied to the reflective substrate 568 to enhance the brightness of the image element 564. The dark zones of the light control outer optic consist of the transparent spaces between the reflective zones. The opaque material 567 prevents the reflective substrate regions 568 from reflecting light back to the observer without having first been reflected from the focusing optics 531. The focusing optics 531 are likewise used as the "inner optic" in this embodiment. The focusing elements are formed by embossing a photopolymer 566 to a transparent substrate 565 and coating the photopolymer surface with a reflective substrate 570. In this embodiment, the focusing optics 531 will function as focusing reflectors. The same photopolymer or other transparent embossing material 566 may be used to emboss the focusing optics 531 and the light control optics 532.

While the invention has been disclosed in preferred forms, it will be obvious to those skilled in the art that many modifications, additions, and deletions may be made therein without departing from the spirit and scope of the invention as set forth in the appended claims.

We claim:

1. A light control material for displaying autostereoscopic or dynamic images formed of a series of image elements, said light control material comprising:

a plurality of focusing elements; and light control optics having dark zones and bright zones, said dark zones and bright zones arranged in a predetermined pattern, and wherein there are a plurality of said focusing elements associated with each image element of the series of image elements, and wherein said dark zones and bright zones cause light to be directed through all of the focusing elements associated with a particular image element in the same direction such that an observer is provided with a view of an autostereoscopic or dynamic image.

2. A light control material as described in claim 1 wherein the bright zones are comprised of a light transmissive material.

3. A light control material as described in claim 1 wherein the light control optics further include a reflective layer for reflecting light at the bright zones.

4. A light control material as described in claim 1 wherein the light control optics comprise a substrate and an opaque material on the substrate for forming the dark zones.

5. A light control material as described in claim 4 wherein the substrate is comprised of a reflective layer and the opaque material covers selected portions of the reflective layer thereby forming the bright zones at those portions of the reflective material not covered by the opaque material.

6. A light control material as described in claim 1 wherein the light control optics comprise a substrate and wherein the substrate is comprised of an opaque material.

7. A light control material as described in claim 4 wherein a diffractive, holographic or diffusing pattern is applied to the bright zones.

8. A light control material as described in claim 4 wherein the opaque material is selected from the group consisting of pigmented ink, light absorbing optical structure or light dispersing optical structure.

9. A light control material as described in claim 1 wherein the focusing optics are selected from the group consisting of refractive optics, diffractive optics and mixed refractive and diffractive optics.

10. A light control material as described in claim 1 further comprising a color filtering means.

11. A light control material as described in claim 10 wherein the color filtering means is an image comprising a series of image elements.

12. A light control material as described in claim 11 wherein the image elements are provided in registration with at least one set of focusing elements.

13. A light control material as described in claim 10 wherein the image elements are provided in sets of at least two image elements and the image elements are provided in registration with the light control optics to provide at least two light focusing directions.

14. A light control material as described in claim 10 wherein the image elements are located between the focusing optics and the light control optics.

15. A light control material as described in claim 10 wherein the image elements are positioned on the side of the focusing optics opposite the light control optics.

16. A light control material as described in claim 10 wherein the image elements are positioned on the side of the light control optics opposite the focusing optics.

17. A light control material as described in claim 1 wherein the focusing optics comprise an outer optic layer and the light control optics comprise an inner optic layer.

18. A light control material as described in claim 1 wherein the focusing optics comprise an inner optic material and the light control optics comprise an outer optic material, said focusing optics including a reflective layer for receiving light passed through the light control optics and reflecting the light back through the light control optics.

19. A light control material as described in claim 1 wherein the light control optics comprise a substrate and wherein the substrate is comprised of a light absorbing layer and a reflective material covers selected portions of the light absorbing layer thereby forming the bright zones.

20. A light control material as described in claim 1 wherein a diffusing pattern is applied to the bright zones.

* * * * *